United States Patent
Nakahama et al.

(10) Patent No.: US 12,340,933 B2
(45) Date of Patent: Jun. 24, 2025

(54) INDUCTOR, DEVICE EQUIPPED WITH INDUCTOR AND METHOD FOR MANUFACTURING INDUCTOR

(71) Applicants: DAIHEN Corporation, Osaka (JP); National Institute of Technology, Hachioji (JP)

(72) Inventors: Masayuki Nakahama, Osaka (JP); Kosuke Maeda, Osaka (JP); Mitsuo Ebisawa, Kyoto (JP); Manabu Ishitobi, Yamatokoriyama (JP)

(73) Assignees: DAIHEN Corporation, Osaka (JP); National Institute of Technology, Hachioji (JP)

( * ) Notice: Subject to any disclaimer, the term of this patent is extended or adjusted under 35 U.S.C. 154(b) by 737 days.

(21) Appl. No.: 16/963,037

(22) PCT Filed: Jan. 17, 2019

(86) PCT No.: PCT/JP2019/001264
§ 371 (c)(1),
(2) Date: Jul. 17, 2020

(87) PCT Pub. No.: WO2019/142861
PCT Pub. Date: Jul. 25, 2019

(65) Prior Publication Data
US 2020/0343036 A1   Oct. 29, 2020

(30) Foreign Application Priority Data

Jan. 18, 2018   (JP) .................................. 2018-006806

(51) Int. Cl.
*H01F 27/24* (2006.01)
*H01F 27/28* (2006.01)
(Continued)

(52) U.S. Cl.
CPC ....... *H01F 27/2823* (2013.01); *H01F 41/061* (2016.01); *H03H 7/40* (2013.01)

(58) Field of Classification Search
CPC .................................................. H01F 27/2823
(Continued)

(56) References Cited

U.S. PATENT DOCUMENTS 4,308,512 A * 12/1981 Capecchiacci .......... H01F 41/04
336/60
5,852,866 A * 12/1998 Kuettner ............... H01F 41/046
336/200
(Continued)

FOREIGN PATENT DOCUMENTS

CN  102682951 A  9/2012
CN  103295754 A  9/2013
(Continued)

OTHER PUBLICATIONS

Notice of Reasons for Refusal for Japanese Application No. 2018-006806 dated Jul. 6, 2021, with its English translation, 8 pages.
(Continued)

*Primary Examiner* — Ronald Hinson
(74) *Attorney, Agent, or Firm* — Bret E. Field; Bozicevic, Field & Francis LLP

(57) ABSTRACT

An example inductor comprises multiple coil parts and each formed by flatwise-winding layers of turns of a flat wire arranged in a radial direction with gaps between each of the layers, and the multiple coil parts are arranged in an axial direction with a clearance. There is provided a clearance between the multiple coil parts, through which air flows, achieving improvement in heat dissipation.

5 Claims, 12 Drawing Sheets

(51) Int. Cl.
*H01F 41/061* (2016.01)
*H03H 7/40* (2006.01)
(58) Field of Classification Search
USPC .................................................. 336/223
See application file for complete search history.

(56) References Cited

U.S. PATENT DOCUMENTS

| | | | |
|---|---|---|---|
| 6,611,188 B2* | 8/2003 | Yeo ..................... | H01L 23/645 |
| | | | 336/200 |
| 10,224,133 B2* | 3/2019 | Ishida ................... | H01F 17/045 |
| 2003/0013264 A1 | 1/2003 | Yeo et al. | |
| 2011/0171806 A1* | 7/2011 | Mi ...................... | H01F 17/0006 |
| | | | 257/E21.022 |
| 2012/0250370 A1 | 10/2012 | Taniguchi et al. | |
| 2013/0293337 A1* | 11/2013 | Lo ........................ | H01F 41/041 |
| | | | 336/200 |
| 2013/0307655 A1 | 11/2013 | Saito et al. | |
| 2015/0061807 A1 | 3/2015 | Chu et al. | |
| 2018/0233265 A1* | 8/2018 | Tsukada .................. | H01F 27/28 |

FOREIGN PATENT DOCUMENTS

| | | |
|---|---|---|
| CN | 103339695 A | 10/2013 |
| JP | S48-059365 A | 8/1973 |
| JP | 2005-142459 A | 6/2005 |
| JP | 2007-027345 A | 2/2007 |
| JP | 2007-35980 A | 2/2007 |
| JP | 2012038935 A | 2/2012 |
| JP | 2012-69786 A | 4/2012 |
| JP | 2012-210082 A | 10/2012 |
| JP | 2014-33037 A | 2/2014 |
| JP | 2015-050451 A | 3/2015 |

OTHER PUBLICATIONS

Office Action for Japanese Application No. 2022-074890 mailed on Jan. 10, 2023, with its machine translation, 7 pages.
English translation of International Search Report for PCT Application No. PCT/JP2019/001264 mailed Mar. 26, 2019, 1 page.
Office Action for Chinese Application No. 201980009030.X mailed on Feb. 24, 2023, with English Translation, 11 pages.
Decision of Refusal for Japanese Application No. 2022-074890 mailed on Mar. 14, 2023, with English Translation, 9 pages.
Request for the Submission of an Opinion for Korean Application No. 10-2020-7020723 mailed Nov. 14, 2023, with its machine translation, 11 pages.

* cited by examiner

F I G. 1
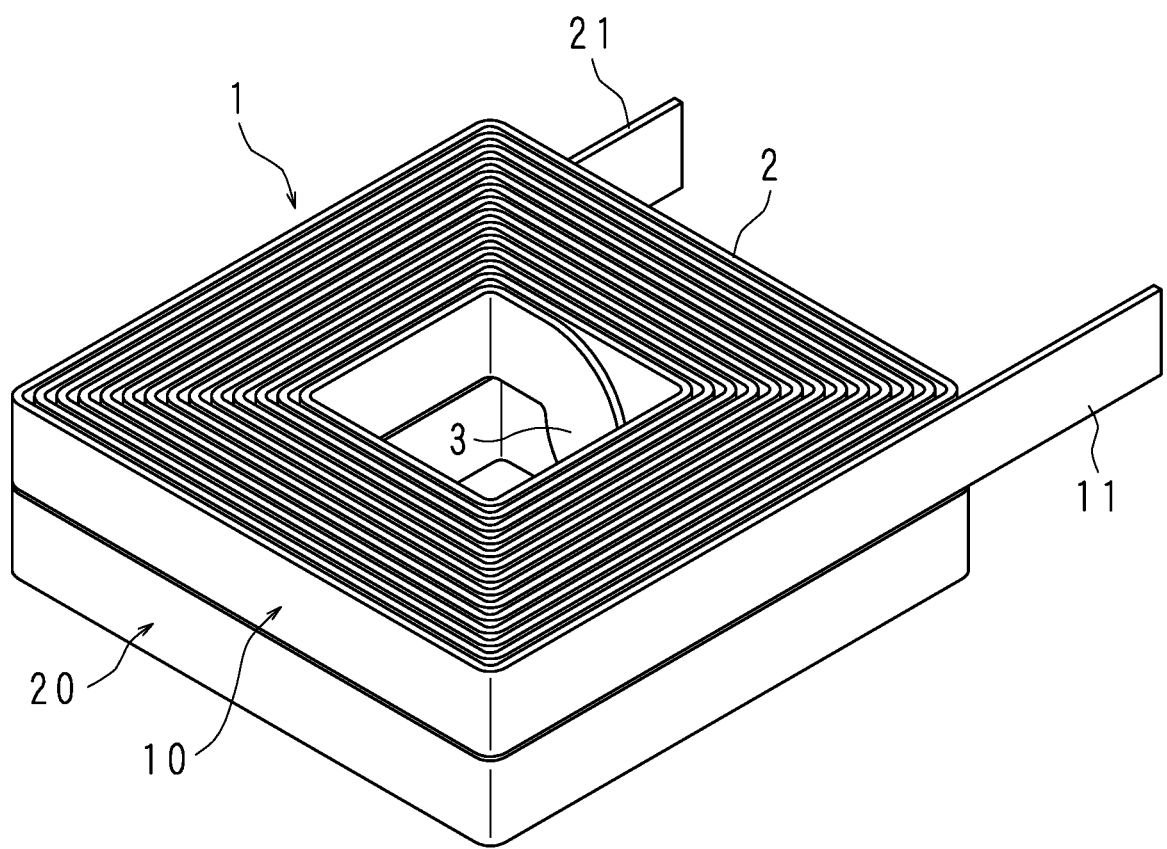

F I G. 2
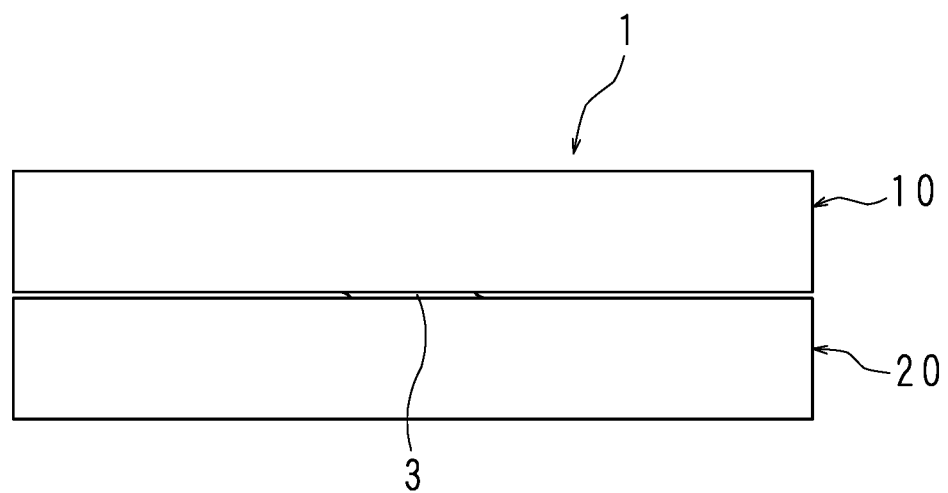

F I G . 1 1
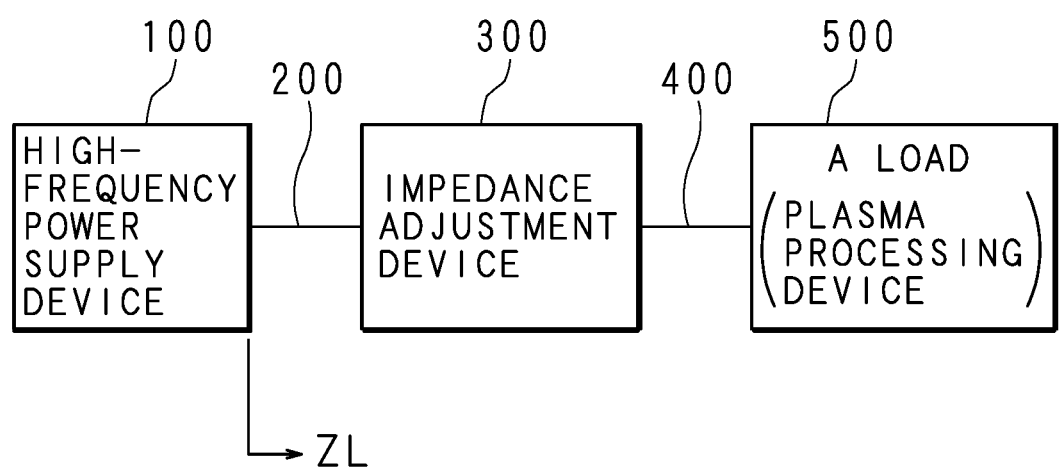

INDUCTOR, DEVICE EQUIPPED WITH INDUCTOR AND METHOD FOR MANUFACTURING INDUCTOR

CROSS-REFERENCE TO RELATED APPLICATIONS

This application is the national phase under 35 U.S.C. § 371 of PCT International Application No. PCT/JP2019/001264 which has International filing date of Jan. 17, 2019 and designated the United States of America.

FIELD

The technology herein relates to an inductor, a device equipped with the inductor and a method of manufacturing the inductor.

BACKGROUND AND SUMMARY

An inductor with a coil formed by flatwise-winding a flat wire has been conventionally proposed. A flat wire, which can be tightly wound and can thus achieve a higher density compared to a round wire, has an advantage of increasing the self inductance of the coil.

As an inductor with such a structure, an inductor with a single layer annular coil formed by flatwise-winding a flat wire onto a core has been previously proposed.

The use of a core produces an effect of increasing the self inductance of the coil as compared with an air-core case in addition to the effect produced by using a flat wire (having a higher density than a round wire).

More inductance can be obtained with an inductor formed by tightly flatwise-winding a flat wire onto a core like the inductor described in Patent Document 1 compared to an inductor having an air-core coil. However, low heat radiation inside the coil (core side) tends to raise the temperature inside the coil. This transfers heat around the inside of the coil to the core, resulting in a temperature rise of the core.

Furthermore, the higher the frequency of the current flowing through the coil is, the larger the iron loss in the core is, and thus, the iron loss is increased at high frequency bands while the amount of heat generated due to the iron loss is increased as well. Hence, if such an inductor is used at a high frequency band (for example, radio frequency band equal to or higher than several hundreds of kHz), the core may exhibit thermal runaway.

Moreover, if such an inductor is used at a high frequency band, the heat generated by the coil itself increases, resulting in damage to the insulating coating (for example, enamel plating, or the like) on the surface of the coil (the surface of the flat wire) in some cases.

An aspect of disclosure is made in view of such circumstances, and the object of the disclosure is to provide an inductor formed by flatwise-winding a flat wire that is capable of improving heat dissipation thereof and is applicable to an operating environment at a high frequency band, a device equipped with the inductor and a method of manufacturing the inductor.

An inductor according to the present disclosure comprises a plurality of coil parts each formed by flatwise-winding layers of turns of a flat wire arranged in a radial direction with gaps between each of the layers, and the plurality of coil parts are arranged in an axial direction with a clearance.

In the present disclosure, there is provided a clearance between the plurality of coil parts, through which air flows, so that heat dissipation can be improved.

In an inductor according to the present disclosure, the flat wire is wound such that a ratio of a radial dimension to an axial dimension of a portion corresponding to the layers of turns of the flat wire is a preset ratio for the plurality of coil parts.

In the present disclosure, the ratio of the radial dimension to the axial dimension of the portion corresponding to the layers of turns of the flat wire is set to a preset ratio for the plurality of coil parts, whereby a desired inductance can be obtained.

In an inductor according to the present disclosure, the ratio of the radial dimension to the axial dimension is approximately 1.

In the present disclosure, the ratio of the radial dimension to the axial dimension is set to approximately 1, whereby the inductance can be increased.

In an inductor according to the present disclosure, each of the coil parts is formed by winding so as to be quadrilateral when viewed from an axial direction.

In the present disclosure, each of the coil parts is formed by winding so as to be quadrilateral, which can minimize the influence of a mutual inductance and maximize a combined inductance of the coil parts per turn.

In an inductor according to the present disclosure, each of the coil parts is air-core.

In the present disclosure, an air-core coil employed for the coil parts can reduce the iron loss, making the characteristics of the inductor linear. If a core is employed for the coil parts, it causes hysteresis in the characteristics of the inductor, which increases fluctuations in the inductor, making it impossible to use the inductor in a device (apparatus) requiring high-precision control.

In an inductor according to the present disclosure, the plurality of coil parts include a first coil part and a second coil part that are axially adjacent to each other, and the first coil part and the second coil part are disposed such that the gaps between the turns of the flat wire for the first coil part are axially continuous with the gaps between the turns of the flat wire for the second coil part.

In the present disclosure, the gaps between the turns of the flat wire forming the first coil part are axially continuous with the gaps between the turns of the flat wire forming the second coil part, which makes the airflow easily pass through the first coil part and the second coil part, whereby an cooling effect by air can be improved.

A device according to the present disclosure is equipped with any one of the inductors described above.

In the present disclosure, the same effects as those of the above-described inductors can be produced.

A method of manufacturing an inductor according to the present disclosure comprising a plurality of coil parts each formed by flatwise-winding layers of turns of a flat wire in a radial direction with gaps between each of the layers includes a step of arranging the plurality of coil parts in an axial direction with a clearance.

In the present disclosure, there is provided a clearance between the plurality of coil parts, through which air flows, so that heat dissipation can be improved.

In a method of manufacturing an inductor according to the present disclosure, the flat wire is wound such that a ratio of a radial dimension to an axial dimension of a portion corresponding to the layers of turns of the flat wire is a preset ratio for the plurality of coil parts.

In the present disclosure, the ratio of the radial dimension to the axial dimension of the portion corresponding to the layers of turns of the flat wire is set to a preset ratio for the plurality of coil parts, whereby a desired inductance can be obtained.

In the inductor, the device equipped with the inductor and the method of manufacturing the inductor according to the present invention, there is provided a clearance between the plurality of coil parts, through which air flows, so that heat dissipation can be improved.

The above and further objects and features will more fully be apparent from the following detailed description with accompanying drawings.

BRIEF DESCRIPTION OF THE DRAWINGS

FIG. 1 is a perspective view schematically illustrating one example of an inductor.

FIG. 2 is an elevation view schematically illustrating one example of the inductor.

FIG. 11 is a view illustrating an example of the configuration of a high-frequency power supply system.

DETAILED DESCRIPTION OF NON-LIMITING EXAMPLE EMBODIMENTS

Figure 3:
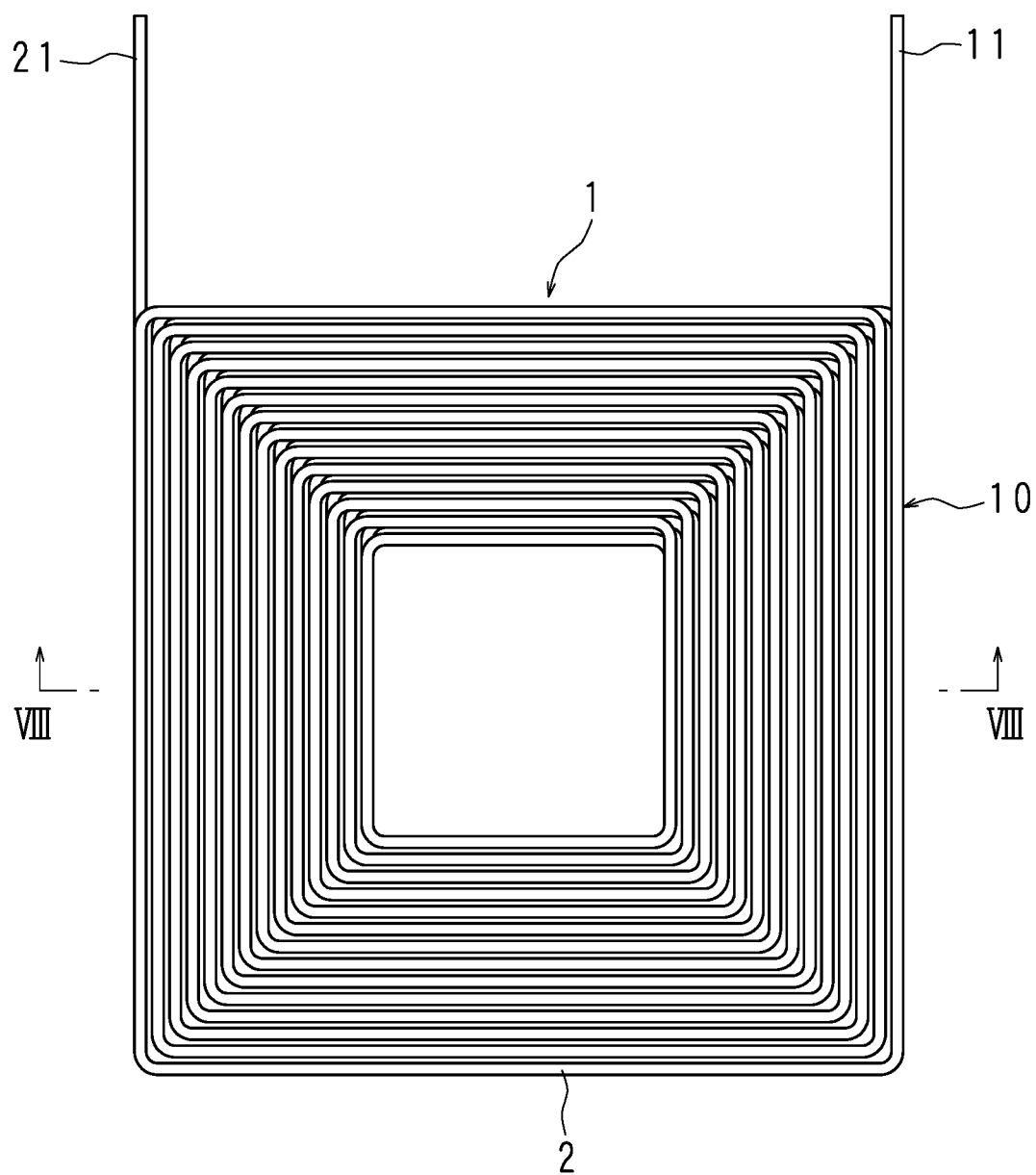
FIG. 3 is a plan view schematically illustrating one example of the inductor.
Figure 4:
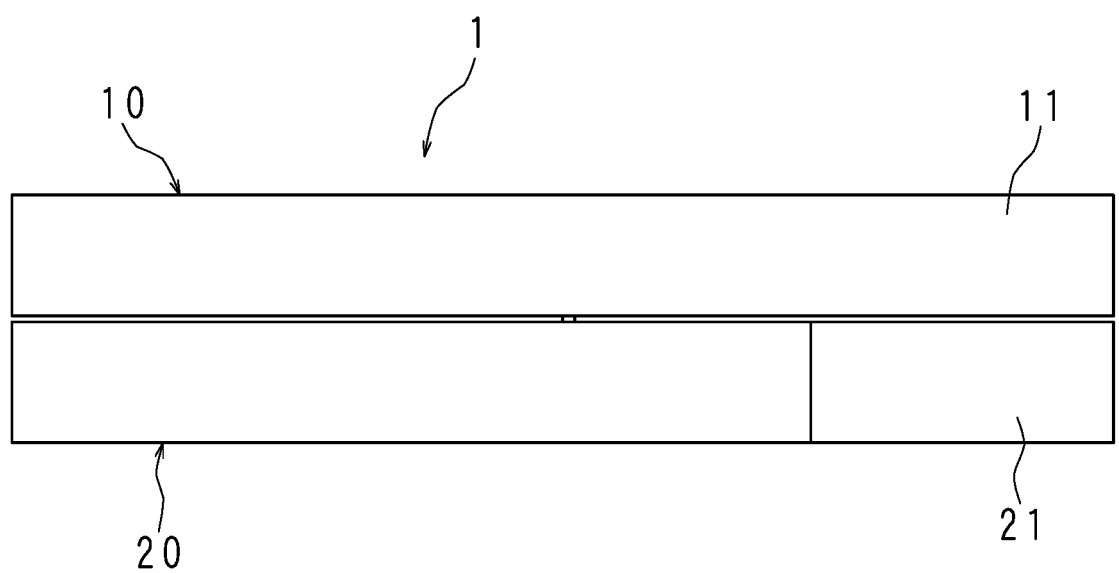
FIG. 4 is a right-side view schematically illustrating one example of the inductor.
Figure 5:
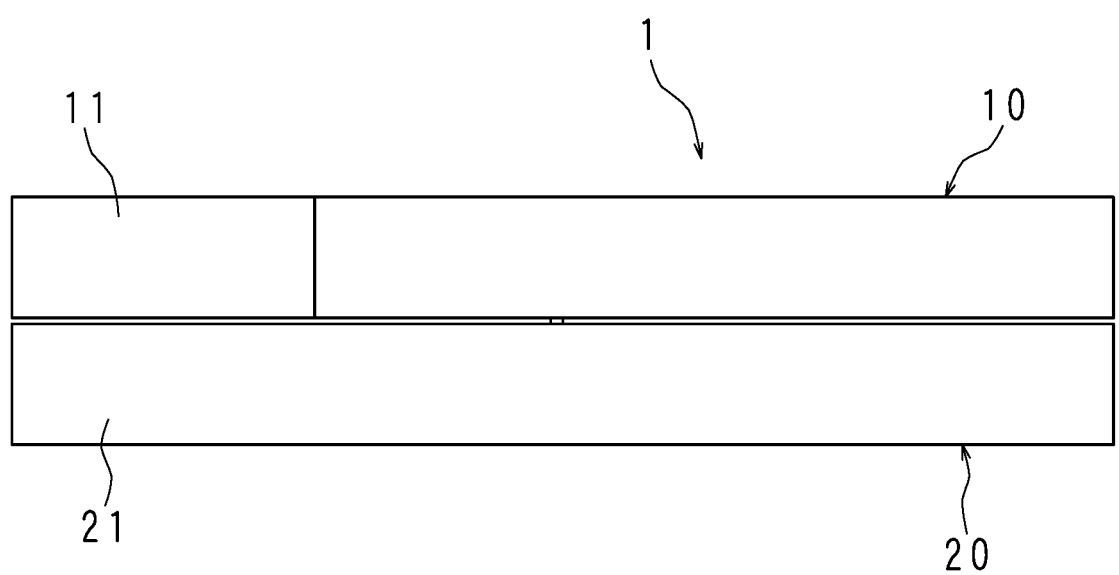
FIG. 5 is a left-side view schematically illustrating one example of the inductor.
Figure 6:
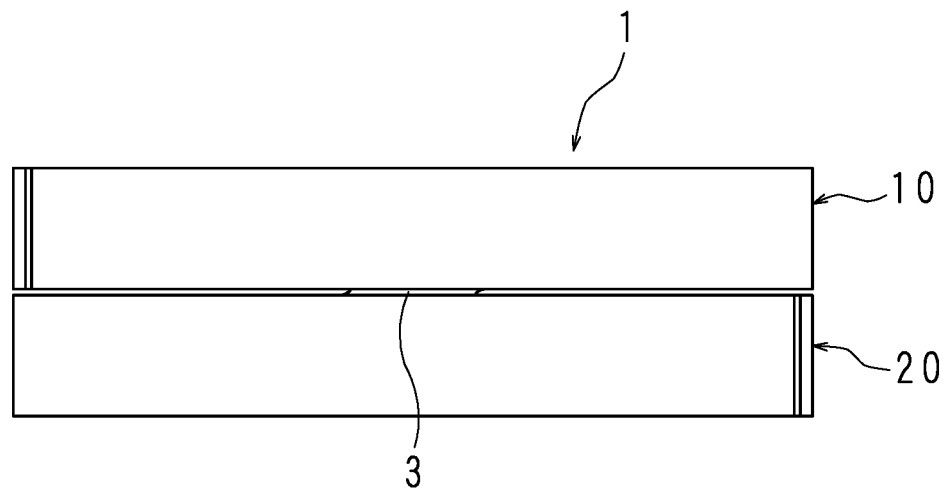
FIG. 6 is a rear view schematically illustrating one example of the inductor.
Figure 7:
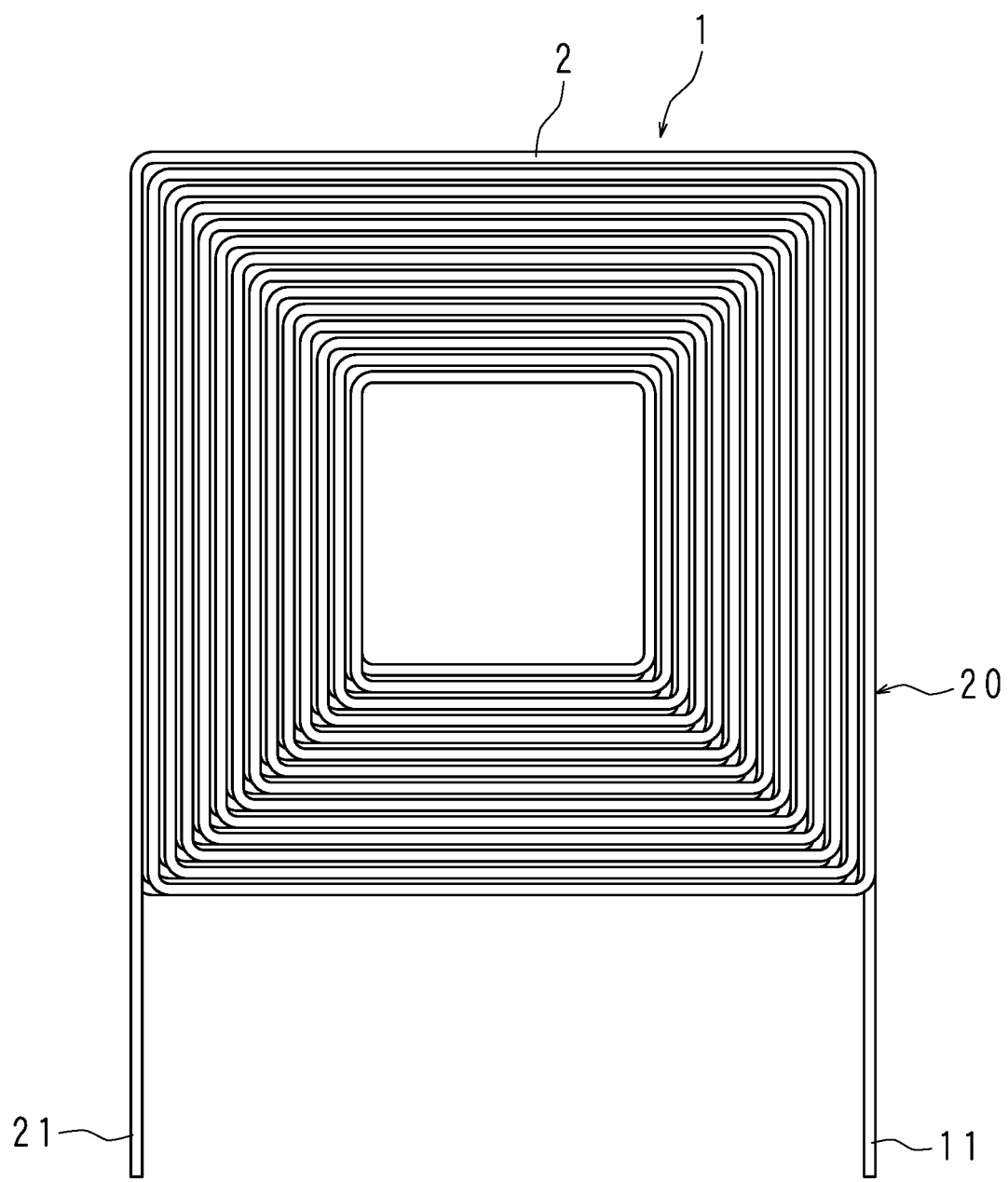
FIG. 7 is a bottom view schematically illustrating one example of the inductor.

An inductor 1 according to an embodiment of the present invention will be described below with reference to drawings. FIG. 1 is a perspective view schematically illustrating the inductor 1, FIG. 2 is an elevation view schematically illustrating the inductor 1, FIG. 3 is a plan view schematically illustrating the inductor 1, FIG. 4 is a right-side view schematically illustrating the inductor 1, FIG. 5 is a left-side view schematically illustrating the inductor 1, FIG. 6 is a rear view schematically illustrating the inductor 1, and FIG. 7 is a bottom view schematically illustrating the inductor 1.

The inductor 1 includes a first coil part 10 and a second coil part 20 that are axially aligned. The first coil part 10 and the second coil part 20 are formed by alpha-winding and connected to each other. Each of the first coil part 10 and the second coil part 20 is formed by flatwise-winding a flat wire 2, and is quadrilateral, for example, square or rectangular when viewed from the axial direction. Each of the first coil part 10 and the second coil part 20 has curved four corners. It is noted that the four corners of the first coil part 10 and the second coil part 20 may also be right-angled.

The first coil part 10 is quadrilateral when viewed from the axial direction. The first coil part 10 is formed by spirally winding the flat wire 2 from outside to inside. Layers of the flat wire 2 are arranged in a radial direction. The end portion of the flat wire 2 located at the outermost turn of the first coil part 10 extends outward so as to be in parallel with a side of the first coil part 10, which is quadrilateral in plan view, and the end portion forms a first terminal 11.

The second coil part 20 is quadrilateral when viewed from the axial direction. The second coil part 20 is formed by spirally winding the flat wire 2 from inside to outside. Layers of the flat wire 2 are arranged in a radial direction. The end portion of the flat wire 2 located at the outermost turn of the second coil part 20 extends outward so as to be in parallel with a side of the second coil part 20, which is quadrilateral in plan view, and the end portion forms a second terminal 21. The second terminal 21 is arranged opposite to the first terminal 11. The first coil part 10 has the same number of coil turns as the second coil part 20.

Figure 8:
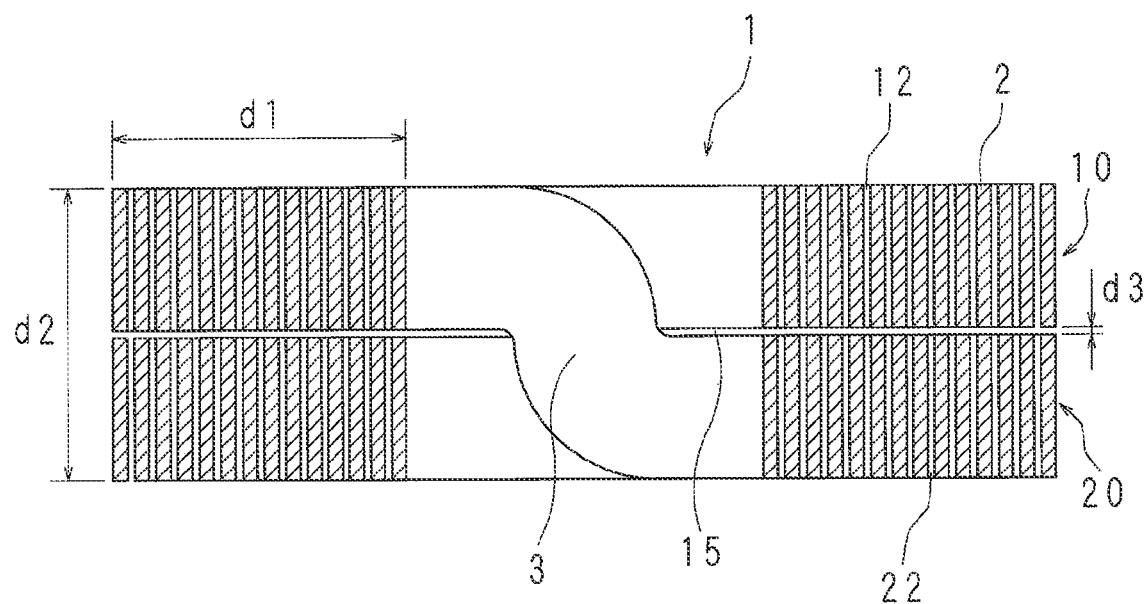
FIG. 8 is a schematic cross-sectional view taken along line VIII-VIII in FIG. 3.

FIG. 8 is a schematic cross-sectional view taken along line VIII-VIII in FIG. 3. As illustrated in FIGS. 1 and 8, the flat wire 2 located at the innermost turn of the first coil part 10 and the flat wire 2 located at the innermost turn of the second coil part 20 are connected by a connection part 3. Each of the first coil part 10 and the second coil part 20 includes no core at the radially central portion, and thus the inductor 1 is air-core. The first coil part 10 and the second coil part 20 are axially arranged with a clearance 15. The clearance 15 has a distance of d3.

As illustrated in FIG. 8, a radial dimension and an axial dimension of the inductor 1 at the portion corresponding to the layers of turns of the flat wire 2 are assumed to be d1 and d2, respectively. The inductor 1 is formed by winding the flat wire 2 such that the radial dimension d1 is equal to the axial dimension d2. In other words, the flat wire 2 is wound so as to have a square cross section, when cut through a surface parallel to the axis of the inductor 1, of the portion corresponding to the layers of turns of the flat wire 2.

As illustrated in FIG. 8, a gap 12 between two adjacent turns of the flat wire 2 for the first coil part 10 is axially continuous with a gap 22 between two adjacent turns of the flat wire 2 for the second coil part 20.

Figure 9:
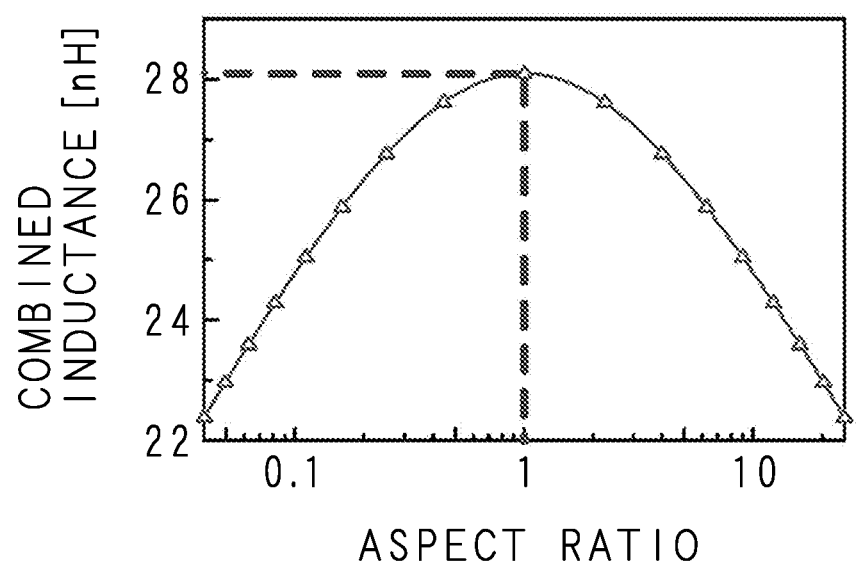
FIG. 9 is a graph showing a relation between an aspect ratio of the cross-sectional configuration of a portion corresponding to layers of turns of the flat wire of the inductor and a combined inductance of the inductor.

FIG. 9 is a graph showing a relation between an aspect ratio of the cross-sectional configuration of the portion corresponding to the layers of turns of the flat wire 2 and a combined inductance of the inductor 1. In FIG. 9, the horizontal axis indicates an aspect ratio while the vertical axis indicates a combined inductance. The aspect ratio corresponds to the radial dimension d1/the axial dimension d2. As illustrated in FIG. 9, if the aspect ratio is 1, that is, if the cross-sectional configuration of the portion corresponding to the layers of turns of the flat wire 2 is square, the value of the combined inductance is maximized.

Hence, setting the aspect ratio to 1 can maximize the inductance per unit weight, which enables miniaturization of the inductor 1. Having an impedance adjustment device equipped with the above-described inductor 1 can contribute to miniaturization of the impedance adjustment device.

As such, it is preferable that the cross-sectional configuration of the portion corresponding to the layers of turns of the flat wire 2 is square (aspect ratio=1), though dimensional errors may occur upon manufacturing in practice. It is thus more realistic to set an allowable error for a desired aspect ratio and to make the aspect ratio of the cross-sectional configuration fall within the allowable error.

As understood from FIG. 9, adjustment of the aspect ratio enables adjustment of a combined inductance. Thus, the aspect ratio can be adjusted so as to achieve a desired combined inductance. In this case as well, it is realistic to set an allowable error for the aspect ratio.

This allows more adequate control in the case where the inductor 1 is incorporated into a device (apparatus) and used. It is noted that the adjustment of the aspect ratio can be made by, for example, adjustment of the distance d3 of the clearance 15 between the first coil part 10 and the second coil part 20. Alternatively, it can be made by adjustment of the distance of the gaps 12 between the turns of the flat wire 2 forming the first coil part 10 or made by adjustment of the distance of the gaps 22 between the turns of the flat wire 2 forming the second coil part 20.

Adjustment of the distances of the clearance 15 and the gaps 12 and 22 as described above can be achieved by inserting an insulating member therebetween and changing the thickness of the insulating member. Alternatively, even if adjustment of the distances of the clearance 15 and the gaps 12 and 22 is not made, an insulating member may be inserted for the purpose of ensuring the clearance or the gaps.

Next, a method of manufacturing the inductor 1 will be described. For example, the flat wire 2 is wound from outside to inside to form the first coil part 10. Then, after the connection part 3 is formed to cause an axial displacement, the flat wire 2 is wound from inside to outside to form the second part 20. The flat wire 2 is formed by alpha winding to manufacture an inductor. Here, the inductor 1 is formed by flatwise-winding such that the radial dimension and the axial dimension of the portion corresponding to the layers of turns of the flat wire 2 are equal to each other. It is noted that the first coil part 10 may be formed after formation of the second coil part 20. It is noted that the flat wire 2 is made of, for example, copper, and the surface thereof is insulation-coated by enamel plating or the like.

In the inductor and the method of manufacturing the inductor according to the present embodiment, the first coil part 10 and the second coil part 20 are axially arranged to make the self inductance larger than the conventional single layer coil part. In addition, the flat wire 2 is wound so as to make the radial dimension and the axial dimension of the portion corresponding to the layers of turns of the flat wire 2 equal to each other, that is, so as to have a square cross-sectional configuration of the portion corresponding to the layers of turns of the flat wire 2 when cut through a surface parallel to the axis of the inductor 1, which can make the self inductance much larger.

Moreover, the inductor 1 is formed by winding so as to be quadrilateral in plan view, and thus can gain the self inductance while ensuring the occupancy of the winding.

In addition, an air-core coil in the inductor 1 can reduce the iron loss, making the characteristics of the inductor linear. If a core is set in the inductor 1, it causes hysteresis, which increases fluctuations in the inductor, making it impossible to use the inductor in a device (apparatus) requiring high-precision control.

Furthermore, the gaps 12 between the turns of the flat wire 2 forming the first coil part 10 are axially continuous with the gaps 22 between the turns of the flat wire 2 forming the second coil part 20, which makes the airflow easily pass through the first coil part 10 and the second coil part 20, achieving improvement in cooling effect by forced-air cooling.

In other words, the winding is formed by the turns of the flat wire 2, and gaps are provided between each of the turns of the flat wire 2 as described above, which enables the airflow to easily pass through the first coil part 10 and the second coil part 20. Hence, the winding itself serves as a heat sink. This can shorten the distance of the gap 12 between the turns of the flat wire 2 and the distance of the gap 22 between the turns of the flat wire 2, which allows for tighter winding and can thus increase the self inductance per unit weight.

In addition, even in the case of large current at a high frequency band, a sufficient cooling effect can be obtained, which can provide protection against damage.

It is preferable that the gaps 12 and the gaps 22 described above are completely continuous with each other in the axial direction, though it is difficult to make the gaps 12 and the gaps 22 completely continuous in the axial direction as illustrated in FIG. 8 because some dimensional errors actually occur in practice.

In other words, the gaps 12 are not always completely continuous with the gaps 22 in the axial direction. Even in such a case, the clearance 15 is provided between the first coil part 10 and the second coil part 20, through which the airflow passes, so that the first coil part 10 and the second coil part 20 can be cooled.

Hence, if a flow of air is produced in the axial direction, that is, from the first coil part 10 to the second coil part 20, or from the second coil part 20 to the first coil part 10, the air flows so as to be in contact with the large area of the flat wire 2, which can improve the cooling effect of the inductor 1 by the air.

It is noted that a flow of air may be produced by provision of a cooling fan, for example. It is natural that a flow of air may be produced in a direction different from the above-described axial direction. For example, a flow of air may be produced in a direction vertical to the above-described axial direction, that is, from right to left or from left to right on the paper in FIG. 8. In such a case, the airflow passes above the first coil part 10, below the second coil part 20, and through the clearance 15 between the first coil part 10 and the second coil part 20 in FIG. 8, so that the inductor 1 can be cooled by the air.

Figure 10:
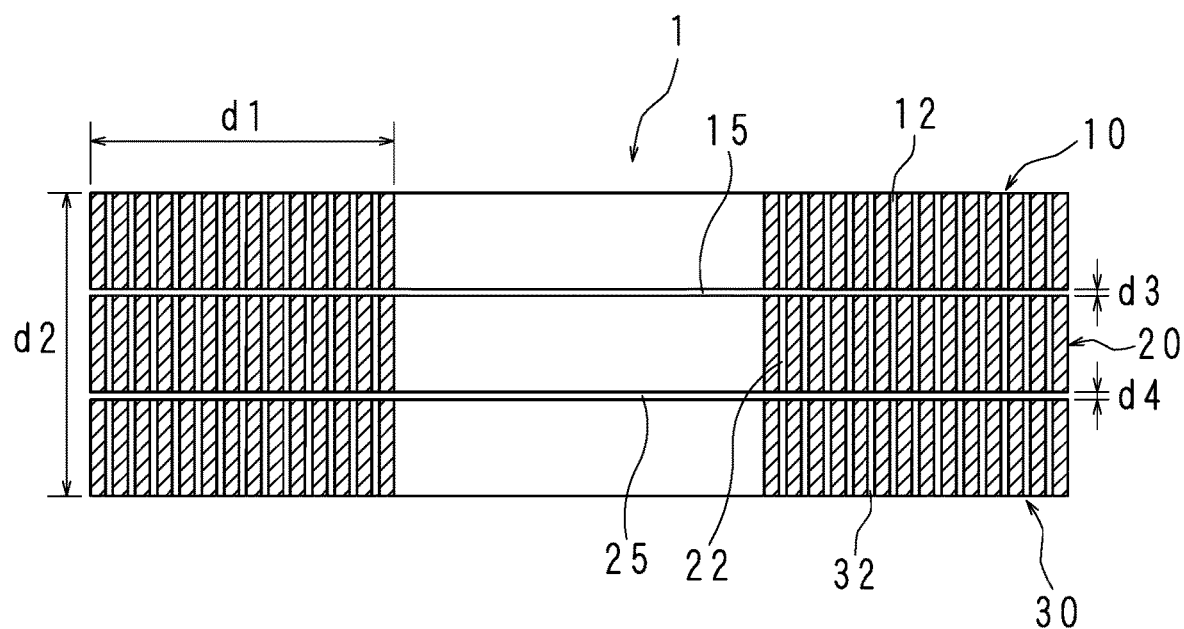
FIG. 10 is a schematic cross-sectional view in the case where three coil parts forming an inductor are employed.

It is noted that the inductor 1 is formed by two coil parts. However, the number of coil parts is not limited thereto, and three or more coil parts may axially be arranged. For example, as illustrated in FIG. 10, the coil parts forming the inductor 1 are assumed to be three coil parts, i.e., a first coil part 10, a second coil part 20 and a third coil part 30. The first coil part 10 and the second coil part 20 are axially arranged with a clearance 15. The second coil part 20 and the third coil part 30 are axially arranged with a clearance 25. The clearance 25 has a distance of d4.

A similar concept to the above description can be applied even in the case where such three or more coil parts forming the inductor 1 are employed. In the example in FIG. 10 as well, setting the aspect ratio (radial dimension d1/axial dimension d2) to 1 is preferable while the aspect ratio can be adjusted so as to have a desired combined inductance. Even in this case as well, it is realistic to set an allowable error for the aspect ratio.

Here, the adjustment of the aspect ratio is made possible by, for example, adjustment of the distances d3 and d4 of the respective clearances 15 and 25 between the coil parts as well as adjustment of the distance of the gaps 12, 22 and 32 between the turns of the respective flat wire 2.

It is noted that FIG. 10 is a schematic cross-sectional view when viewed from a direction different from that in FIG. 8. The connection part 3 as illustrated in FIG. 8 is thus not illustrated, but there is provided a connection part for connecting the first coil part 10 and the second coil part 20 similarly to FIG. 8. In addition, the second coil part 20 and the third coil part 30 are connected at the outside of the inductor 1.

The following describes a case where the inductor described in the embodiment above is incorporated into an apparatus (mainly industrial apparatus). As one example, the inductor is assumed to be incorporated into an impedance adjustment device 300 being a part of a high-frequency power supply system.

FIG. 11 is a view illustrating an example of the configuration of a high-frequency power supply system. The high-frequency power supply system is a system for performing processes, for example, plasma etching, plasma CVD, etc. on a work piece, such as a semiconductor wafer, a liquid crystal substrate, or the like, and is constituted by a high-frequency power supply device 100, a transmission line 200, an impedance adjustment device 300 (also called an impedance matching device), a load connection unit 400 and a load 500 (plasma processing device). The high-frequency power supply device 100 supplies high-frequency power to the load 500 through the transmission line 200, the impedance adjustment device 300 and the load connection unit 400. In the load 500 (plasma processing device), gas for plasma discharge is introduced into a chamber (not illustrated) in which a work piece is placed, and by supplying high-frequency power from the high-frequency power supply device 100 to electrodes (not illustrated) in the chamber, the gas for plasma discharge is discharged to thereby change the state of the gas from a non-plasma state to a plasma state. Then, the work piece is processed by using the gas in the plasma-state.

It is noted that the high-frequency power supply device 100 is a device for supplying to the load 500 high-frequency power (high-frequency voltage) at a radio frequency band (generally, frequencies of several hundred KHz or several tens of MHz, for example, 400 kHz, 2 MHz, 13.56 MHz, 50 MHz, or the like, though much higher band of frequencies (several hundred MHz, etc.) may be used).

In the load 500 such as the plasma processing device used for the plasma etching, the plasma CVD, etc., the state of the plasma varies with time as manufacturing process advances. This varies the impedance of the load 500 (load impedance) with time. In order to efficiently supply power to such a load 500 from the high-frequency power supply device 100, an impedance ZL (hereinafter referred to as a load-side impedance ZL) viewed from the output terminal of the high-frequency power supply device 100 toward the load 500 side needs to be adjusted as the load-side impedance varies. Thus, in the high-frequency power supply system, the impedance adjustment device 300 is interposed between the high-frequency power supply device 100 and the load 500 (plasma processing device 5).

The impedance adjustment device 300 is provided between the high-frequency power supply device 100 for supplying the load 500 with high-frequency power and the load 500, and adjusts the load-side impedance ZL by adjusting the electric characteristics (capacitance and inductance) of variable electric characteristic elements (variable capacitor and variable inductor) internally provided. In the impedance adjustment device 300, by setting the electric characteristics of the variable electric characteristic elements to adequate values, the impedance of the high-frequency power supply device 100 is matched to the impedance of the load 500, whereby the reflected wave power from the load 500 toward the high-frequency power supply device 100 is made as little as possible while power supply to the load is made maximum.

Figure 12:
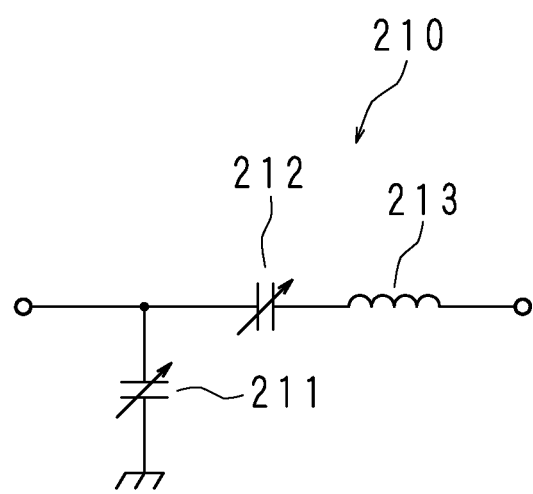
FIG. 12 is a circuit diagram of an impedance adjustment circuit provided in an impedance adjustment device.

FIG. 12 is a circuit diagram of an impedance adjustment circuit 210 provided in the impedance adjustment device 300. The impedance adjustment circuit 210 is formed by, for example, a first variable capacitor 211, a second variable capacitor 212 and an inductor 213. The inductor 1 described in the embodiment above can be employed for the inductor 213. It is noted that the impedance adjustment circuit 210 in FIG. 12 is the so-called "reverse L type," though the inductor 1 described in the embodiment above may be employed for the inductor in another type (for example, "π type," or the like) of the impedance adjustment circuit 210.

Meanwhile, in the impedance adjustment circuit 210 of the impedance adjustment device 300, large current at a high frequency band flows through the inductor 213, which requires any measures against heat radiation to be taken. Furthermore, a strong demand for miniaturization of the impedance adjustment device 300 leads to a request for miniaturization of the components thereof.

As described above, the inductor 1 in the present embodiment can increase inductance per unit weight, which enables miniaturization of the inductor 1. Hence, having the impedance adjustment device 300 equipped with the above-described inductor 213 can contribute to the miniaturization of the impedance adjustment device 300. Naturally, the inductor 1 can be incorporated into another apparatus as well as the impedance adjustment device 300. For example, it can also be applied to the high-frequency power supply device 100 illustrated in FIG. 11. More advantageous is a case where large current at a high frequency band flows through the inductor 1. As can be understood from the above description, application to an apparatus used at a high frequency band or an apparatus including the inductor 1 through which large current flows is advantageous.

It is to be noted that, as used herein and in the appended claims, the singular forms "a", "an", and "the" include plural referents unless the context clearly dictates otherwise.

The present embodiment disclosed above is illustrative in all respects and not restrictive. The technical features described in respective embodiments can be combined, and all changes that fall within meets and bounds of the claims, or equivalence of such meets and bounds are therefore intended to be embraced by the claims.

The invention claimed is:

1. An inductor comprising a plurality of coil parts each formed by flatwise-winding layers of turns of a flat wire arranged in a radial direction with gaps between each of the layers, wherein
    the plurality of coil parts are arranged in an axial direction with a clearance,
    the plurality of coil parts include a first coil part and a second coil part that are axially adjacent to each other,
    the clearance is sandwiched between the first coil part and the second coil part in the axial direction,
    the first coil part and the second coil part are disposed such that the gaps between the turns of the flat wire for the first coil part are axially continuous with the gaps between the turns of the flat wire for the second coil part,
    the inductor further comprises a cooling fan which is arranged so that a flow of air is produced through the gaps between the turns of the flat wire for the first coil part, through the gaps between the turns of the flat wire for the second coil part and through the clearance between the first coil part and the second coil part, and
    the inductor further comprises a connection part that connects the flat wire located most inwardly in the first coil part and the flat wire located most inwardly in the second coil part, wherein
    the connection part is included in inner peripheral surfaces of the first coil part and the second coil part, an area inside the first coil part and the second coil part is hollow, each of the coil parts is formed by winding so as to be quadrilateral when viewed from an axial direction, the first coil part and the second coil part are formed by alpha-winding, an end portion of the flat wire located at the outermost turn of the first coil part extends outward so as to be in parallel with a side of the first coil part along a circumferential direction of the first coil part, and the end portion forms a first terminal, and an end portion of the flat wire located at the outermost turn of the second coil part extends outward so as to be in parallel with a side of the second coil part along a circumferential direction of the second coil part, and the end portion forms a second terminal.

2. The inductor according to claim 1, wherein the flat wire is wound such that a ratio of a radial dimension to an axial dimension of a portion corresponding to the layers of turns of the flat wire is a preset ratio for the plurality of coil parts.

3. The inductor according to claim 2, wherein the ratio of the radial dimension to the axial dimension is approximately 1.

4. A device equipped with the inductor according to claim 1.

5. The inductor according to claim 1, wherein the flat wire located most inwardly in the first coil part and the flat wire located most inwardly in the second coil part comprise the connection part.

* * * * *